United States Patent [19]
Doerr et al.

[11] Patent Number: 5,987,050
[45] Date of Patent: Nov. 16, 1999

[54] LASER TRANSMITTER BASED ON A COUPLER AND HAVING A CONTROLLED OUTPUT PORT

[75] Inventors: Christopher Richard Doerr, Middletown; Charles H. Joyner, Red Bank Township, Monmouth County, both of N.J.

[73] Assignee: Lucent Technologies, Inc., Murray Hill, N.J.

[21] Appl. No.: 09/192,700

[22] Filed: Nov. 16, 1998

[51] Int. Cl.⁶ ....................................................... H01S 3/08
[52] U.S. Cl. ............................... 372/108; 372/98; 372/26; 385/140; 385/14; 385/24; 385/37
[58] Field of Search ........................... 372/9, 108, 29, 372/26, 98, 28; 385/140, 14, 24, 37

[56] References Cited

U.S. PATENT DOCUMENTS

| | | | |
|---|---|---|---|
| 5,136,671 | 8/1992 | Dragone | 385/37 |
| 5,412,744 | 5/1995 | Dragone | 385/24 |
| 5,524,014 | 6/1996 | Kaminow et al. | 372/28 |
| 5,875,272 | 2/1999 | Kewwitsch et al. | 385/37 |
| 5,881,199 | 3/1999 | Li | 385/140 |

OTHER PUBLICATIONS

"An 8 channel digitally tunable transmitter with electroabsorbtion modulated ouput by selective–area epitaxy" IEEE Phot. Tech. Let. vol. 7, No. 9, Sep. 1995 pp. 1013–1015 by Joyner et. al.

"Optimum design of a planar array of tapered waveguides," published in J.Opt.Soc. Am. A, vol. 7, No. 11, Nov. 1990 by C. Dragone.

*Primary Examiner*—Leon Scott, Jr.

[57] ABSTRACT

A laser transmitter based on a star coupler includes a separate controlled output port. An interferometric modulator is incorporated inside a laser cavity by means of a star coupler and enables modulation of the laser signal, independent of the means of wavelength selection used to determine the frequency of the laser.

22 Claims, 6 Drawing Sheets

5,987,050

LASER TRANSMITTER BASED ON A COUPLER AND HAVING A CONTROLLED OUTPUT PORT

CROSS-REFERENCE TO RELATED APPLICATIONS

Related subject matter is disclosed in the concurrently filed application entitled "MULTICHANNEL LASER TRANSMITTER WITH A SINGLE OUTPUT PORT" by the same inventors, C. R. Doerr and C, H. Joyner, both applications being assigned to the same Assignee.

TECHNICAL FIELD OF THE INVENTION

This invention relates to lasers and, more particularly, to a laser transmitter based on a coupler having a separate controlled output port, as well as an improved method of controlling an optical signal from a laser.

BACKGROUND OF THE INVENTION

To make optimal use of the bandwidth available in a fiber based network, it is desirable to use as many separately detectable wavelength channels as possible and to encode data onto each wavelength at as high a speed as possible. One problem with lasers that deliver multiple channels is that the cavity length for many of them is long, making direct modulation above 1 GHz impractical due to the round trip time of a photon in the cavity. A possible solution is to use an output power tap on the main laser cavity and to modulate this output while the main laser cavity runs in continuous wavelength mode. (see C. H. Joyner et. al. "An 8 channel digitally tunable transmitter with electroabsorbtion modulated output by selective-area epitaxy" IEEE Phot. Tech. Let. vol. 7, no.9, September 1995 pp. 1013–1015 or the pending patent application entitled "Improved tunable transmitter with Mach-Zehnder Modulator," Ser. No. 09/016,176, filed on Jan. 30, 1998 by C. H. Joyner. In both of the above cases the modulator was external to the laser cavity.

For increased modulation rates at lower drive voltages, it is desirable to integrate a modulator capability into a laser transmitter and to change from absorptive modulation to phase modulation.

SUMMARY OF THE INVENTION

In accordance with the present invention, a laser transmitter based on a star coupler includes a separate controlled output port. An interferometric modulator (e.g., a Mach-Zehnder modulator) is incorporated inside a laser cavity by means of a star coupler and enables pulse switch control and data encoding of the laser signal, independent of the means of wavelength selection used to determine the frequency of the laser.

More particularly, in accordance with the present invention, a laser transmitter comprises a star coupler including a free-space region having at least two arm pairs, each arm pair including left and right arms. The laser cavity includes a first arm pair, an amplifier and a wavelength selective element, a first arm of the first arm pair connected to a first reflective termination, and a second arm of the first arm pair connected to a second reflective termination. A series connection of a second arm pair and a controllable phase shifter has a first end connected to a first output port of the transmitter, a second end connected to a third reflective termination. The controllable phase shifter is used to control the laser signal outputted at the first output port.

DETAILED DESCRIPTION

In the following description, each item or block of each figure has a reference designation associated therewith, the first number of which refers to the figure in which that item is first described (e.g., 101 is first described in FIG. 1).

Figure 1:
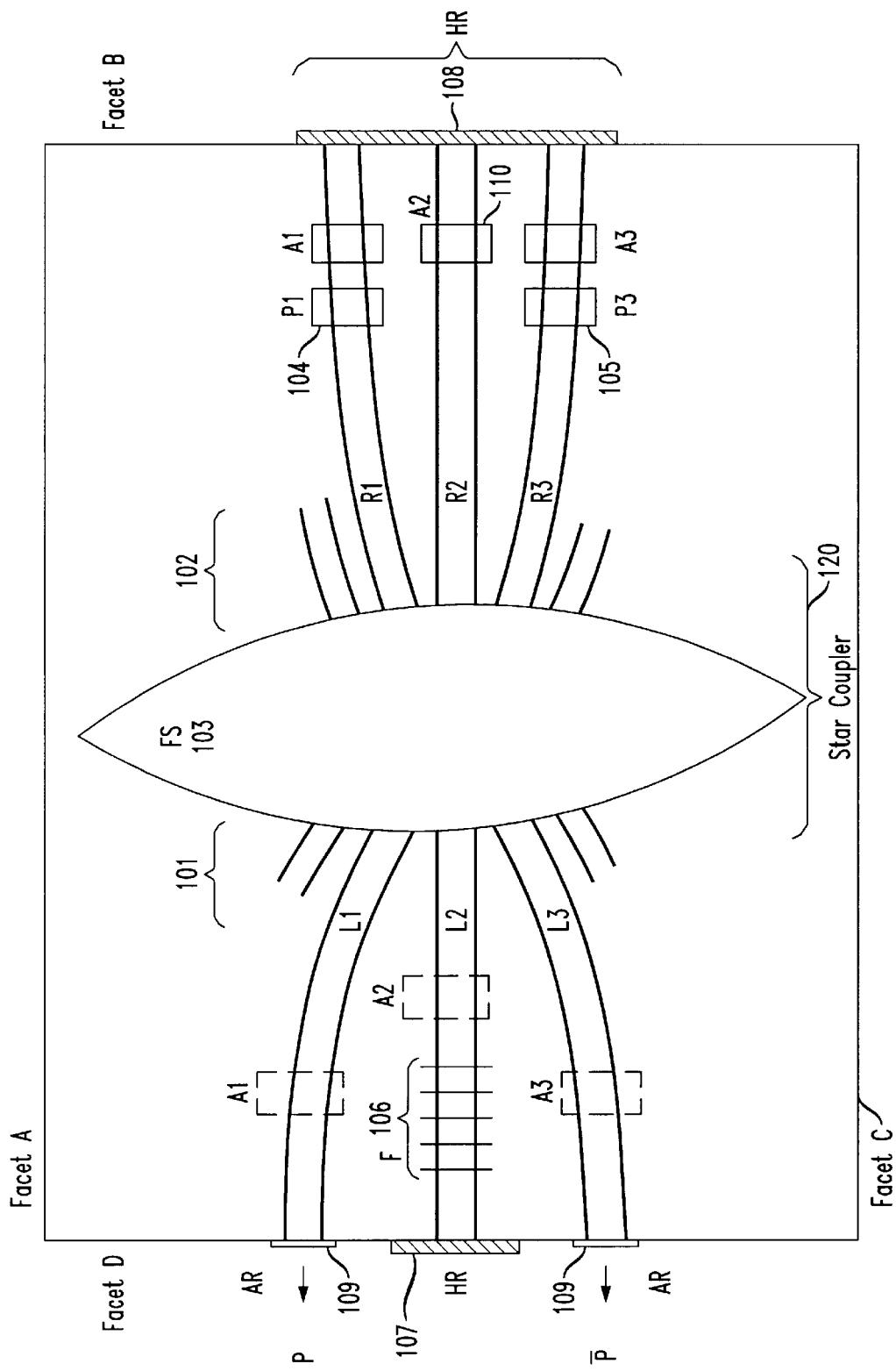
FIG. 1 shows, in accordance with the present invention, an illustrative block diagram of an illustrative 3 by 3 star coupler laser transmitter for providing a single wavelength output.

The basic schematic of a 3 by 3 coupler is shown in FIG. 1. The invention includes a star coupler 120 in which the input and output arms (or waveguides) to the left 101 and right 102 of the free-space region [FS] 103 are symmetrically spaced. It should be noted that in place of a star coupler, a well-known multimode interference (mmi) coupler or evanescent coupler could be used. A wavelength $\lambda_x$ signal exiting any of the waveguides R1–R3 is radiated into the free space region 103 and arrives somewhat equally at the waveguides L1–L3. If the phase of the wavelength $\lambda_x$ signal from each of the waveguides R1–R3 are all equal, then all of the wavefronts constructively combine at the entrance to waveguides L1–L3. If, however, the phase of the wavelength $\lambda_x$ signal from each of the waveguides R1–R3 are not the same then some destructive combining of the wavefronts occurs at waveguides L1–L3. As will be discussed in a later paragraph, the amount of destruction depends on the phase difference between the wavefronts radiated from the waveguides R1–R3. The laser signal generated in the arrangement of FIG. 1 will operate in a single transverse mode if the width and height of the cavity elements are restricted to a size that will not support multimode operation.

If the star coupler 120 input (left) and output (right) arms 101 and 102 are strongly coupled, the efficiency of the 3 by 3 coupler of FIG. 1 is increased. This occurs when the mode profile of each waveguide (e.g., R2, L2) overlaps strongly with the mode profile of its adjacent neighbors (i.e., R1, R3 and L1, L3, respectively). In this manner, wavefronts are created in adjacent waveguides as the waveguides enter the free-space region even though the laser signal may only have been injected into a single waveguide at some distance from the free-space region where the mode profile of the adjacent waveguides did not overlap. Thus, for example a wavelength $\lambda_x$ signal originating on waveguide R2, at some distance from the free-space region 103, becomes coupled to waveguides R1 and R3 near the free-space region 103 and the wavefronts of wavelength $\lambda_x$ would then exit from each of R1–R3 into the free-space region 103. The star coupler 120 can be implemented as described in the article by C.

Dragone entitled "Optimum design of a planar array of tapered waveguides," published in J. Opt. Soc. Am. A, Vol. 7, No. 11, Nov. 1990 and incorporated by reference herein.

The waveguides R1, R2, and R3 to the right of FS 103 terminate at facet B that has a high reflection HR coating 108. Each of these arms R1–R3 contains an amplifier section, A1–A3, for gain and/or control of the optical power amplitude in that waveguide. The waveguides R1 and R3 also contain phase adjustment elements, P1 and P3, which allow the optical phase of that arm to be adjusted either by application of current or voltage signal 104 and 105, respectively, to P1 and P3. To the left of FS unit 103, waveguides arms L1 and L3 terminate, respectively, at output ports p and p-bar at facet D, which has an antireflection AR coating. Waveguide L2 contains a wavelength selective element 106 to choose a single wavelength among those allowed by the gain spectrum of the amplifier sections A1–A3. This element, while illustratively represented schematically as a grating, may also be a waveguide grating router, a coupler, filter or any other optical element used to select wavelength. The main CW laser cavity is defined by the HR mirror 107 on facet D, on the left, wavelength selective element 106, waveguide L2, FS 103, waveguide R2, amplifier A2, and the HR mirror 108 on the right. The amplifier A2, and hence the laser signal from the transmitter, can be turned on and off via lead 110.

The free-space region FS 103 and the associated waveguides to the right and left, R1–R3 and L1–L3, behave as a 3×3 coupler. The relationships for conservation of optical power as a function of amplitude and phase among the 6 ports for a lossless star coupler are given by the following equations:

$$L = AR \text{ with } A = A^{-1}$$

Where L is a vector denoting the power in waveguides L1, L2 and L3. The variable R is a vector denoting the power in waveguides R1, R2, and R3. A is the matrix of coefficients denoting the phase relationship between vectors R and L given by $$A = 1/\sqrt{3} \begin{bmatrix} -1/2 - j\sqrt{3}/2 & 1 & -1/2 + j\sqrt{3}/2 \\ 1 & 1 & 1 \\ -1/2 + j\sqrt{3/2} & 1 & -1/2 - j\sqrt{3}/2 \end{bmatrix}$$

$$= 1/\sqrt{3} \begin{bmatrix} e^{-\Pi j 2/3} & 1 & e^{-\Pi j 2/3} \\ 1 & 1 & 1 \\ e^{+\Pi j 2/3} & 1 & e^{-\Pi j 2/3} \end{bmatrix}$$

Figure 2:
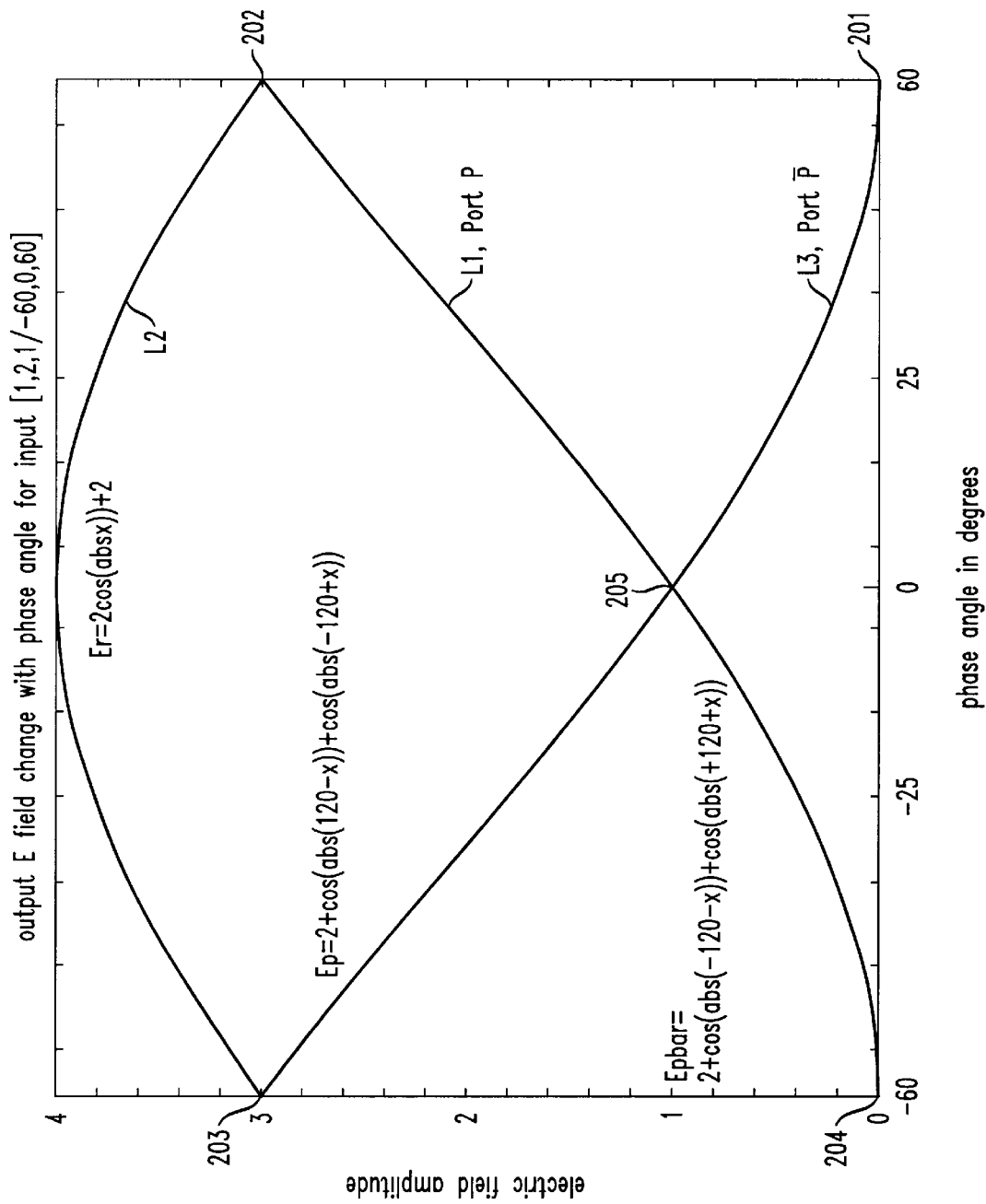
FIG. 2 shows a plot of the electric field amplitudes over a range of phase shifts at all three ports.

With reference to FIG. 2, there is shown the variation in electric field magnitudes |Er|, |Ep|, and |Epbar| (in the waveguides L1; L2; and L3, respectively, of FIG. 2) with changes in the phase shifts in the arms R1 and R3 relative to the phase in arm R2. As shown, for example, if the power density in arm R2 is twice that in arms R1 and R3 and the phase of the electric field vector in waveguide R1 is rotated −60° relative to R2 while the phase in R3 is rotated +60° relative to R2, then no power emerges from waveguide L3 at port p-bar, 201. However, 9/16 of the power density (Ep²) in arm L2 will emerge from arm L1 at port p, 202. If the sign of the phase shifts is reversed for arms R1 and R3 via the phase shifters P1 and P3 respectively, then this condition will reverse and power will be delivered to port p-bar, 203, while none will emerge from port p, 204. Thus for the described initial power densities, a phase shift swing of +/−60° will drive the device to modulate (or switch) power between ports p and p-bar. This is to be compared to a conventional extra-cavity Mach-Zehnder interferometer modulator, which requires +/−90° of phase shift.

It should be noted that the electric field amplitudes that exist over a range of phase shifts for all three ports are shown in FIG. 2. Thus, when the relative phase in R3 is zero and the relative phase in R1 is zero, the electric field from ports p and p-bar are both 1 unit, 205, or 1/16 of the power of the laser. In this manner it is possible to get equal and complementary outputs at the output ports p and p-bar of the laser transmitter of FIG. 1. There are many other solutions to the set of the above-described transcendental equations. We note that in general the voltage or current required, on control leads 104 and 105, to produce a phase change in phase shifters P1 and P3 of FIG. 1, via an index change, is modest so that such a device is particularly suited to high speed operation.

Figure 3:
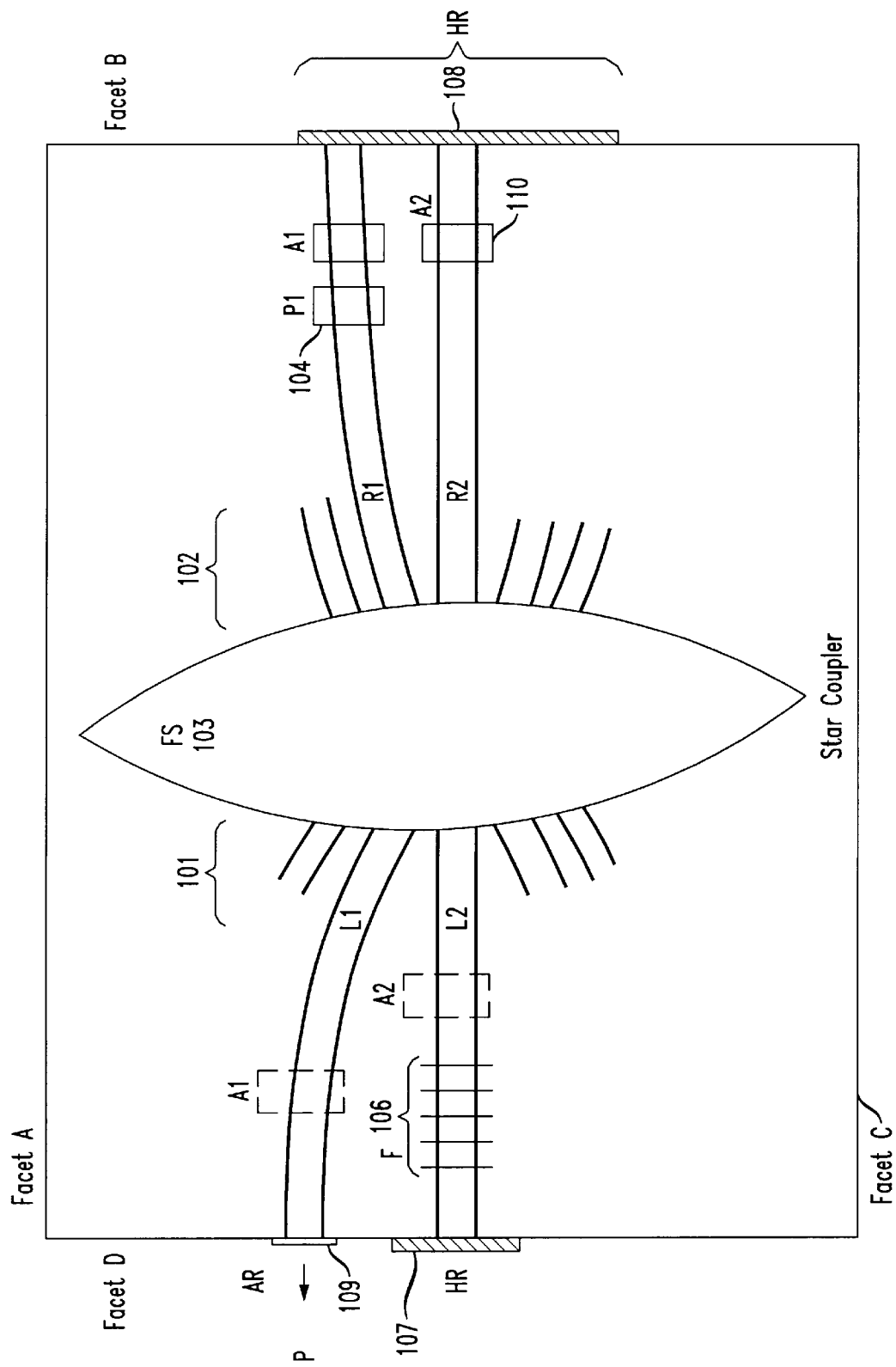
FIG. 3 shows, in accordance with the present invention, a more general illustrative 2 by 2 star coupler laser transmitter for providing a single wavelength output.

We also note that when the complementary output signal, p-bar, is not required then the device can also be constructed from a 2×2 star coupler with less efficiency. This is shown in FIG. 3 where the arms R3 and L3, phase shifter P3 and amplifier A3 have been removed.

Returning to FIG. 1, It should be noted that it is also possible to construct the same functionality with higher order n by n couplers with even greater efficiency at the expense of having n phase shifting elements P and n amplifiers A to control. It is also possible to direct arm L1 to facet A and arm L3 to facet C, if it is desired to have each facet entirely of one reflectivity type. The Facets B and D are reflective or highly reflective HR, while facets A and C are anti-reflective AR. In principle any of the amplifiers A1, A2, and A3 can be located anywhere in arms L1–L3 or R1–R3 (e.g., see the dotted elements A1–A3, in FIG. 1). However, when the amplifiers A1, A2, and A3 are located in arms L1, L2, and L3, respectively, the gain must be twice the value when these amplifiers are located in the arms R1, R2, and R3. This is because when the amplifiers A1, A2, and A3 are located in arms R1, R2 and R3, the signal traverses in one direction through the amplifiers and is then reflected back through the amplifiers in the opposite direction, therefore the amplifiers need only half the gain. Wavelength selector F 106 may also be located in waveguide R2 instead.

In WDM network applications it is desirable to produce a number of modulated lasers signals as cheaply and cost effective as possible. While the FIG. 1 and 2 modulated laser transmitters offer an improvement over prior modulated laser transmitters, they still only operate on one wavelength at a time. What is desired in WDM systems is to generate multiple wavelengths simultaneously on the same device.

Figure 4:
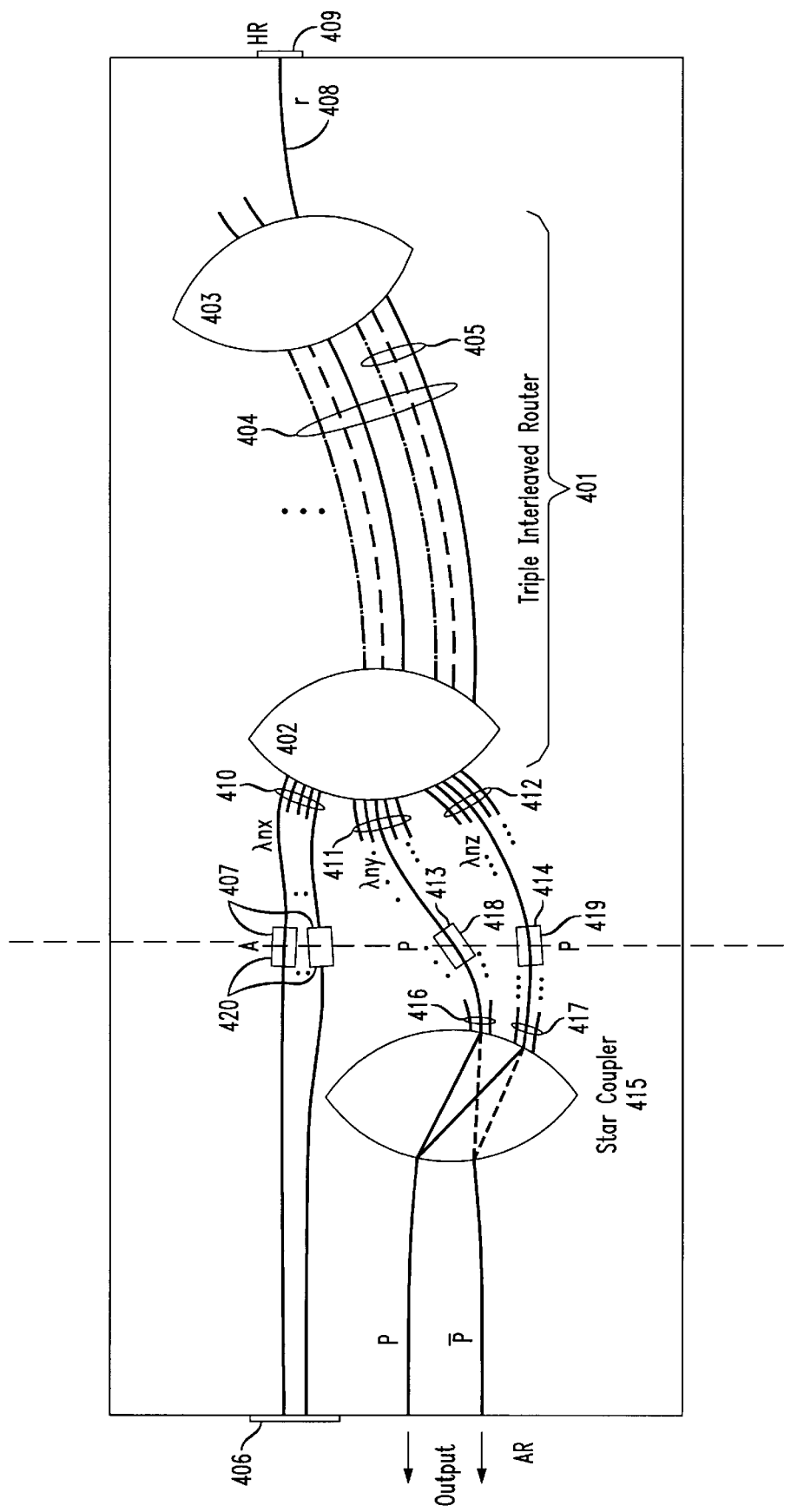
FIG. 4 shows a first embodiment of a multichannel transmitter with a single output port.

In accordance with the present invention, we have combined the function of a 3×3 star coupler (of FIG. 1) with a interleaved-chirped wavelength selection element in a compact way to produce a multichannel transmitter with a single output port, where all the channels are independently modulated at high speed. One embodiment of this arrangement is shown in FIG. 4. As shown, a triple interleaved-chirped waveguide grating router 401 including two star couplers 402 and 403 interconnected by an array of waveguide arms 404. The interleaved-chirped waveguide grating router 401 has waveguide arms 404 that are divided into groups of three arms 405. In each group of three waveguides 405, every third arm is given an additional path length of $\lambda_c 3$, while the other two waveguide grating arms in each group remain the same length as for a conventional waveguide grating router.

A. Such a triple interleaved router is described in the pending U.S. patent application entitled "Wavelength-Division-Multiplexing Cross-Connect using Angular Dispersive Elements and Phase Shifters" by C. R. Doerr, Ser. No. 08/923,304. filed on Sep. 4, 1997 and incorporated by reference herein. This patent application describes a technique for implementing a WDM cross-connect using two "interleaved-chirped" waveguide grating routers interconnected by controllable phase shifters, the description of which is incorporated by reference herein.

Figure 5:
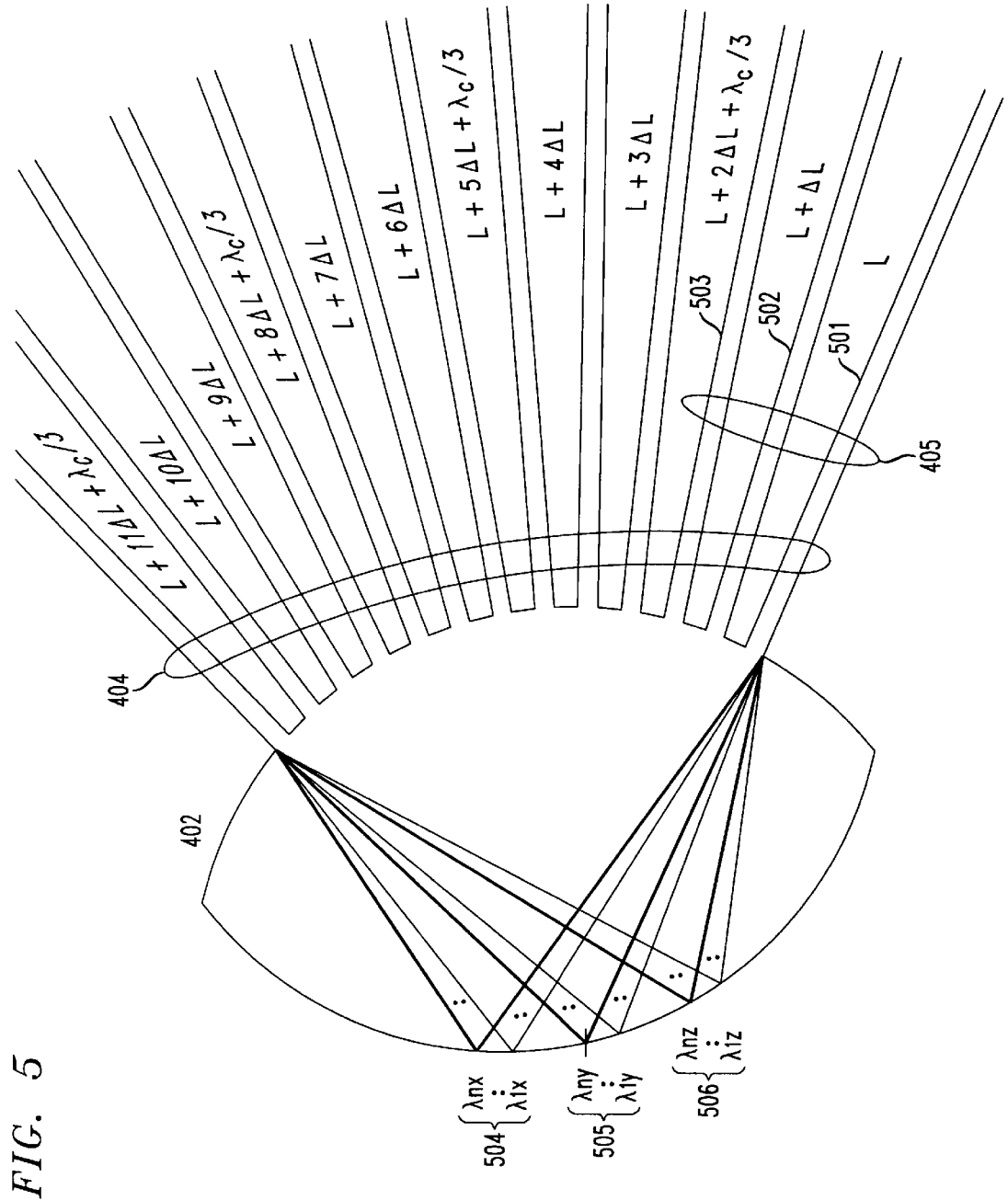
FIG. 5 shows star coupler with an array of waveguide arms which are triple interleaved and chirped.

With reference to FIG. 5 there is shown, illustratively, the star coupler 402 and the length of each arm in the array of waveguide arms 404. In group 405, the length of the first two arms 501 and 502 have the conventional length, while the third arm 503 has an extra length $\lambda_c/3$, where $\lambda_c$ is the desired laser wavelength This pattern is repeated in the other groups of arms in 404. This triple interleave chirp produces three primary Brillouin image zones 504–506, for each of the group of wavelengths $\lambda_{1x}-\lambda_{nx}$, $\lambda_{1y}-\lambda_{ny}$, and $\lambda_{1z}-\lambda_{nz}$, that are radiated from each of the waveguides 404. Note that a separate image is formed for each different wavelength in each image zone 504–506. Returning to FIG. 4, each of the wavelengths in the groups $\lambda_{nx}$, $\lambda_{ny}$, and $\lambda_{nz}$ travels over a separate waveguide in the groups 410, 411, and 412, respectively.

In FIG. 4, a laser for each wavelength $\lambda_n$ is formed using a laser cavity that includes HR 406, amplifier 407, a waveguide of group 410, star coupler 402, the waveguides 404, star coupler 403, path r 408, and HR 409. In this manner, the path between port r and ports nx comprise the n carrier wave (CW) lasing cavities for the n wavelengths $\lambda_n$. Powering amplifier A in arm nx, via lead 420, turns on the associated laser wavelength $\lambda_n$. Each of the n wavelengths in $\lambda_{ny}$, and $\lambda_{nz}$ also has its own output port in groups 411 and 412, respectively, as well as its own phase shifter, 413 and 414, respectively. Star coupler 415 is a 2n by 2 coupler which couples each of the wavelengths $\lambda_{ny}$ in waveguide group 416 and $\lambda_{nz}$ in waveguide group 417 to either output p or p-bar under control of control signals 418 and 419. The operation of star coupler 415 and phase shifters 413 and 414 is the same as that previously described for FIG. 1.

Figure 6:
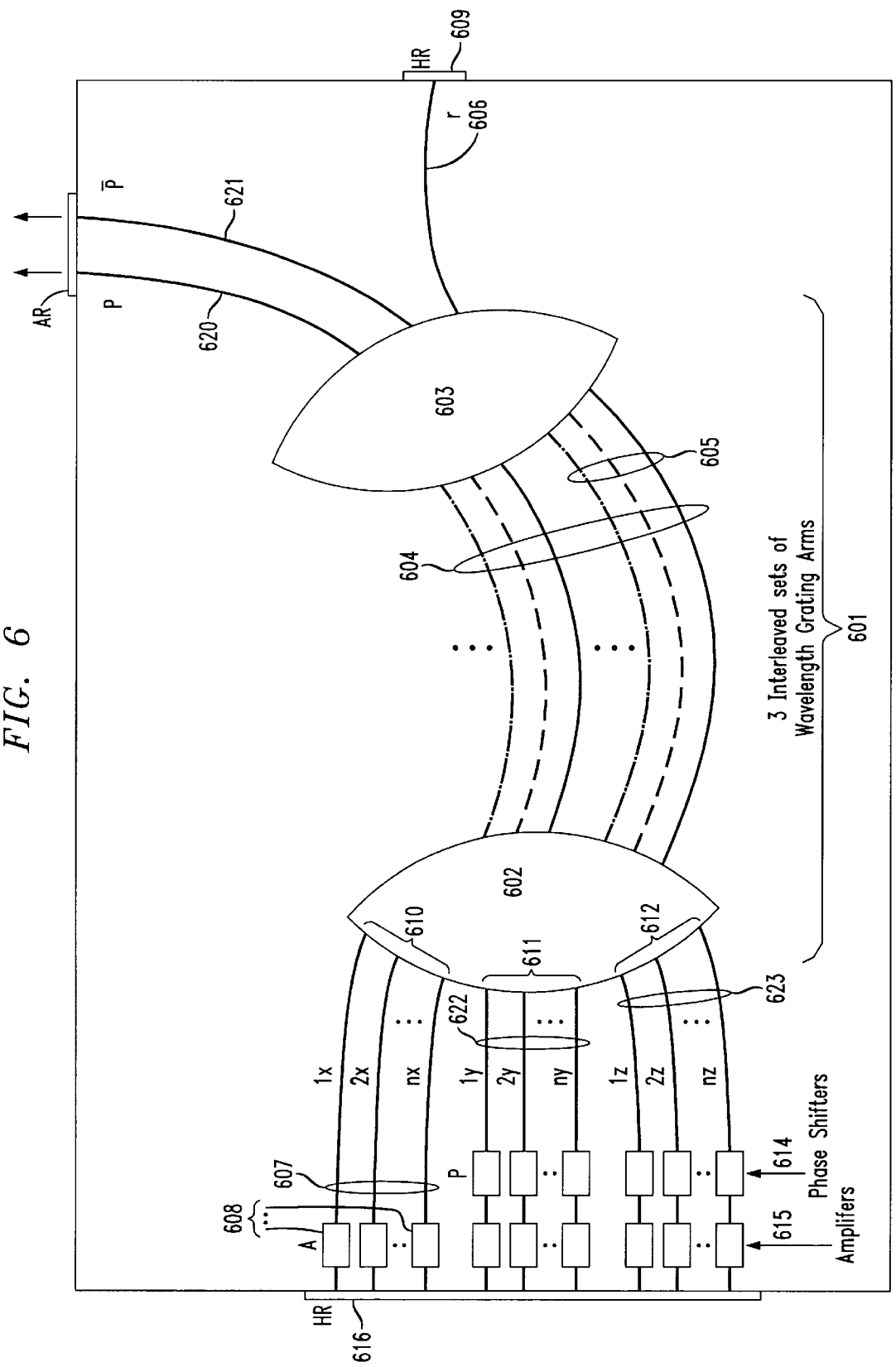
FIG. 6 shows, in accordance with the present invention, an illustrative diagram of a multichannel transmitter with a single output port where all the channels are independently modulated at high speed.

Shown in FIG. 6 is a preferred embodiment of our multichannel transmitter with a single output port. As shown, a triple interleaved-chirped waveguide grating router 601 includes two star couplers 602 and 603 interconnected by an array of waveguide arms 604. The interleaved-chirped waveguide grating router (WGR) 601 has waveguide arms 604 that are divided into groups of three arms 605. In each group of three waveguides 605, every third arm is given an additional path length of $\lambda_c/3$, while the other two waveguide grating arms in each group remain the same length as for a conventional waveguide grating router. The interleave-chirped WGR 601 may be of the type described in the previously referenced Doerr patent application.

Each path between arm r and one of the arms nx comprise a CW lasing cavity for one of the n wavelength lasers. With reference to FIG. 5, the length L is the length of the shortest waveguide in the grating arms 405. Returning to FIG. 6. the arms r and nx terminate in HR surfaces 609 and 616. Powering an amplifier A in arm nx, via a lead 608, turns on the associated wavelength $\lambda$.n. Ports p and p-bar output a laser signal and its complement, respectively, via an AR surface 617. For optimal performance all arms x, y, and z should be the same length. Due to possible 4-wave mixing in the common waveguide r, arm r should be kept as short as possible.

In operation, a portion of each of the n laser wavelengths is coupled from path r, via star coupler 603, to each of the three waveguides in each group, e.g., 605. In the same manner as was discussed with respect to FIG. 5, the n wavelength signals from each of the n groups 605 are coupled to three of the interleaved chirp-created Brillouin zones 610–612. The resulting wavelengths in groups $\lambda_{1x}-\lambda_{nx}$; $\lambda_{1y}-\lambda_{ny}$; and $\lambda_{1z}-\lambda_{nz}$, are outputted over the associated waveguides groups 1x–nx, 1y–ny, 1z–nz, respectively. Under control of signal 608, amplifier A amplifies the wavelength signals $\lambda_{1x}-\lambda_{nx}$ on waveguides 1x–nx. The associated phase shifter P and amplifier A set the phase and magnitude, respectively, of each wavelength on waveguides 1y–ny and 1z–nz, under control of control signals 614 and 615, respectively. The HR surface 616 reflects these wavelengths back through the waveguides 1x–nx, 1y–ny, and 1z–nz; star coupler 602; waveguides 604; to star coupler 603. At star coupler 603, a portion of the wavelength signals $\lambda_{1x}-\lambda_{nx}$; $\lambda_{1y}-\lambda_{ny}$; and $\lambda_{1z}-\lambda_{nz}$ go to path r to support laser operation and to one or both of the output ports p and p-bar. The phase vs. power output equations for ports p and p-bar are identical to the those of the above single wavelength device as shown in FIG. 2.

Advantageously, the device of FIG. 6, provides many individually modulated wavelength channels yet is very compact in size. Using phase shift as the modulation mechanism not only allows for modulation at high speed with low current (or voltage), but by choosing the proper modulation waveform, the chirp of the outgoing signal may be tailored as well. Another advantage of this device of FIG. 6, is that because it is used in reflective mode, the optical signal passes through each phase shifter twice. Therefore the phase shifters P may be half the length or run at half the voltage (or current), as compared to using phase shifter P in the arms 620 and 621. For a similar reason, the amplifiers A are used in arms 1y–ny and 1z–nz rather than in the arms 620 and 621.

In much the same manner as that described in FIG. 3, in an alternate embodiment of the invention of FIG. 6, we may eliminate either the y set 622 or the z set 623 of n waveguides, and the associated amplifiers A and phase shifter PS, and the associated output port p or p-bar. Such an embodiment would, however, be less efficient than that of FIG. 6.

Many of the elements of the present invention may be implemented as described in the previously referenced Doerr patent application. Additionally, while the arrangement of FIG. 6, has been described as using WGR 601, it should be understood that other types of angular dispersive elements may be utilized. For example, the unit 601 can be an angular dispersive element implemented using a virtually imaged phase array (VIPA) as described in the article by M. Shirasaki entitled "Large angular dispersion by a virtually imaged phase array and its application to a wavelength demultiplexer", OPTICS LETTERS, Vol. 21, No. 5, March 1996. Another type of angular dispersive element, which may be used, is a well-known reflecting grating.

Thus, what has been described is merely illustrative of the application of the principles of the present invention. Hence, other arrangements can be implemented by those skilled in the art without departing from the spirit and scope of the present invention.

What is claimed is:

1. A laser transmitter comprising
    a coupler including a free-space region having at least two arm pairs, each arm pair including a left arm and a right arm;
    a laser cavity including a first arm pair, an amplifier and a wavelength selective element, a first arm of the laser cavity being connected to a first reflective termination and a second arm of the laser cavity being connected to a second reflective termination;

a series connection of a second arm pair and a controllable phase shifter, a first end of said series connection being connected to a first output port of the transmitter, a second end of said series connection connected being connected to a third reflective termination, and wherein the controllable phase shifter is used to control a laser signal outputted at the first output port.

2. The laser transmitter of claim 1 wherein the coupler is a star coupler including a free-space region having said at least two arm pairs connected thereto.

3. The laser transmitter of claim 1 wherein the coupler is a multimode interference (mmi) coupler.

4. The laser transmitter of claim 1 wherein the coupler is an evanescent coupler.

5. The laser transmitter of claim 1 wherein wherein a mode profile of each arm pair strongly overlaps a mode profile of an adjacent neighbor arm pair.

6. The laser transmitter of claim 1 wherein the first and third reflective terminations are part of the same reflective termination.

7. The laser transmitter of claim 1 wherein the amplifier connects to a first arm of said first arm pair and the wavelength selective device connects to a second arm of said first arm pair.

8. The laser transmitter of claim 1 wherein the controllable phase shifter is responsive to a control signal for modulating the laser signal outputted at the first output port.

9. The laser transmitter of claim 1 wherein the controllable phase shifter is responsive to a control signal for switching the laser signal away from the first output port.

10. The laser transmitter of claim 1 including a second amplifier connected in series with the second arm pair and the controllable phase shifter for controlling the power level of the laser signal outputted at the first output port.

11. The laser transmitter of claim 10 wherein the first output port connects to a first arm of the second arm pair and a second arm of the second arm pair connects to a series connection of the amplifier and controllable phase shifter.

12. The laser transmitter of claim 11 wherein the second arm of the second arm pair connects to the amplifier.

13. The laser transmitter of claim 1 wherein the coupler includes a third arm pair, a second series connection formed by the third arm pair connected in series with a second controllable phase shifter and a fourth reflective termination.

14. The laser transmitter of claim 13 wherein the coupler further includes a second output port of the laser transmitter being connected to a first end of said second series connection, the second end of said second series connection connected to the fourth reflective termination.

15. The laser transmitter of claim 13 including a third amplifier connected in series with the third arm pair and wherein the first and second controllable phase shifters control the power level of the laser signal outputted at the first and second output ports.

16. The laser transmitter of claim 15 wherein the second output port connects to a first arm of the third arm pair and a second arm of the third arm pair connects to a series connection of the third amplifier and second controllable phase shifter.

17. The laser transmitter of claim 16 wherein the second arm of the third arm pair connects to the second amplifier.

18. The laser transmitter of claim 13 wherein when the first and second controllable phase shifter are both set to zero phase, the laser signal at the first and second output ports are equal in magnitude but opposite in phase.

19. The laser transmitter of claim 13 wherein when the first and second controllable phase shifter have a phase that is set equal to a predetermined number less than or equal to 90 degrees magnitude but opposite in sign, the laser signal appears at only one of the output ports.

20. A method of controlling the output of an optical signal generated by a laser transmitter comprising the steps of:

providing a coupler including a free-space region having at least two arm pairs, each arm pair including a left arm and a right arm;

forming a laser cavity including a first arm pair, an amplifier and a wavelength selective element, a first arm of the laser cavity being connected to a first reflective termination and a second arm of the laser cavity being connected to a second reflective termination;

forming a series connection of a second arm pair and a controllable phase shifter, a first end of said series connection being connected to a first output port of the transmitter, a second end of said series connection connected being connected to a third reflective termination; and adjusting a phase delay of the controllable phase shifter to control a laser signal outputted at the first output port.

21. The method of claim 20 further comprising the steps of:

providing the coupler with a third arm pair;

forming a second series connection including the third arm pair connected in series with a second controllable phase shifter and a fourth reflective termination; and adjusting a phase delay of the first and second controllable phase shifters to control the power level of the laser signal outputted at the first output port.

22. The method of claim 20 further comprising the steps of:

including a second output port of the laser transmitter which is connected to a first end of said second series connection, the second end of said second series connection connected to the fourth reflective termination; and adjusting a phase delay of the first and second controllable phase shifters to control the power level of the laser signal outputted at the first and second output ports.

* * * * *